(12) United States Patent
Nakamura et al.

(10) Patent No.: US 9,167,689 B2
(45) Date of Patent: Oct. 20, 2015

(54) WIRING SUBSTRATE AND METHOD FOR MANUFACTURING WIRING SUBSTRATE

(71) Applicant: SHINKO ELECTRIC INDUSTRIES CO., LTD., Nagano (JP)

(72) Inventors: Atsushi Nakamura, Nagano (JP); Tsukasa Nakanishi, Nagano (JP); Takayuki Matsumoto, Nagano (JP); Kiyokazu Sato, Nagano (JP); Osamu Hoshino, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 178 days.

(21) Appl. No.: 13/773,948

(22) Filed: Feb. 22, 2013

(65) Prior Publication Data

US 2013/0233607 A1    Sep. 12, 2013

(30) Foreign Application Priority Data

Mar. 7, 2012   (JP) .................. 2012-050719

(51) Int. Cl.
| H05K 1/02 | (2006.01) |
| H05K 1/11 | (2006.01) |
| H05K 3/40 | (2006.01) |
| H05K 1/03 | (2006.01) |
| H05K 3/00 | (2006.01) |

(52) U.S. Cl.
CPC ............ *H05K 1/0296* (2013.01); *H05K 1/0206* (2013.01); *H05K 1/115* (2013.01); *H05K 3/4038* (2013.01); *H05K 1/0265* (2013.01); *H05K 1/0393* (2013.01); *H05K 3/0061* (2013.01); *H05K 2201/10106* (2013.01); *H05K 2203/1545* (2013.01); *Y10T 29/49165* (2015.01)

(58) Field of Classification Search
CPC ..................................... H05K 1/0296
See application file for complete search history.

(56) References Cited

U.S. PATENT DOCUMENTS

| 6,617,680 B2 * | 9/2003 | Chien-Chih et al. .......... 257/698 |
| 6,857,767 B2 | 2/2005 | Matsui et al. |
| 7,154,048 B2 * | 12/2006 | Kikuchi et al. ............... 174/261 |

FOREIGN PATENT DOCUMENTS

JP   2003-092011   3/2003

* cited by examiner

*Primary Examiner* — Jeremy C Norris
(74) *Attorney, Agent, or Firm* — IPUSA, PLLC

(57) ABSTRACT

A wiring substrate includes an insulation substrate including a first surface, a second surface on an opposite side of the first surface, and first and second through-holes penetrating the insulation substrate from the first surface to the second surface; a wiring layer formed on the first surface of the insulation substrate; a first via formed in the first through-hole and connected to the wiring layer; a bus line positioned away from the wiring layer and the first via, and formed on the first surface of the insulation substrate; and a second via formed in the second through-hole and connected to the bus line.

15 Claims, 15 Drawing Sheets

WIRING SUBSTRATE AND METHOD FOR MANUFACTURING WIRING SUBSTRATE

CROSS-REFERENCE TO RELATED APPLICATIONS

This application is based upon and claims the benefit of priority of the prior Japanese Patent Application No. 2012-050719 filed on Mar. 7, 2012, the entire contents of which are incorporated herein by reference.

FIELD

The embodiments discussed herein are related to a wiring substrate and a method for manufacturing the wiring substrate.

BACKGROUND

Conventionally, there is an illumination apparatus having a flexible substrate including a front surface and a rear surface on the opposite side of the front surface. The substrate has multiple LEDs (Light Emitting Diodes) mounted on a wiring pattern formed on the front surface and multiple heat radiation plates mounted on the rear surface.

The multiple heat radiation plates are adhered to the substrate to cover parts of the substrate corresponding to areas on which the LEDs are mounted. The heat radiation plates may be adhered to the substrate with an adhesive agent.

As described in, for example, Japanese Laid-Open Patent Publication No. 2003-092011, the conventional illumination apparatus has a LED mounted on a wiring substrate including a substrate, a wiring pattern (wiring), and a heat radiation plate.

In the wiring substrate of the conventional illumination apparatus, the wiring and the heat radiation plate are connected by way of a substrate that is formed of a resin material (e.g., fiberglass reinforced plastic) having a low thermal conductivity.

Therefore, the wiring substrate of the conventional illumination apparatus is unable to efficiently transfer heat generated by an electronic component having a heat generating property (e.g., LED) from the wiring on the front surface of the substrate to the heat radiation plate on the rear surface of the substrate.

SUMMARY

According to an aspect of the invention, there is provided a wiring substrate including: an insulation substrate including a first surface, a second surface on an opposite side of the first surface, and first and second through-holes penetrating the insulation substrate from the first surface to the second surface; a wiring layer formed on the first surface of the insulation substrate; a first via formed in the first through-hole and connected to the wiring layer; a bus line separated from the wiring layer and the first via, and formed on the first surface of the insulation substrate; and a second via formed in the second through-hole and connected to the bus line.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

DESCRIPTION OF EMBODIMENTS

In the following, illustrative embodiments of the present invention are described with reference to the accompanying drawings.

<First Embodiment>

Figure 1:
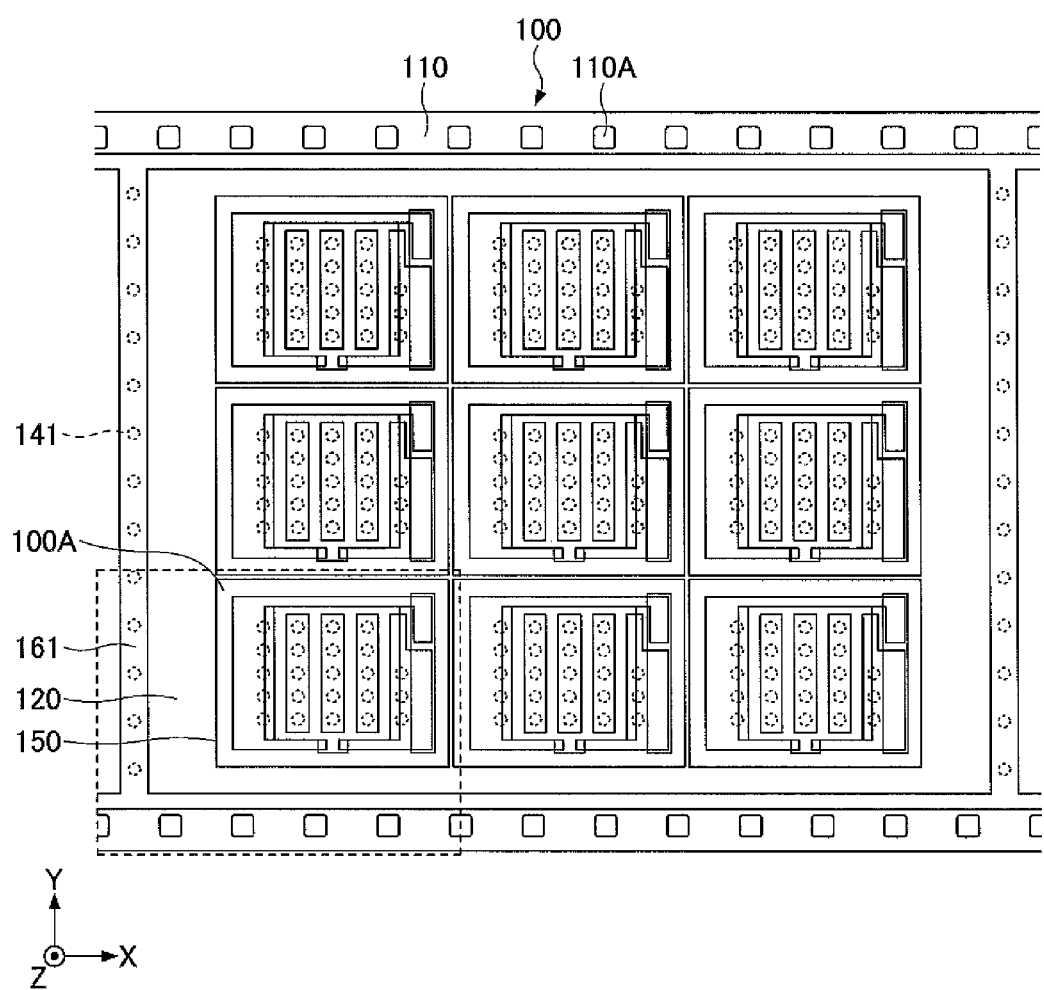
FIG. 1 is a plan view illustrating a wiring substrate according to a first embodiment of the present invention.
Figure 2A:
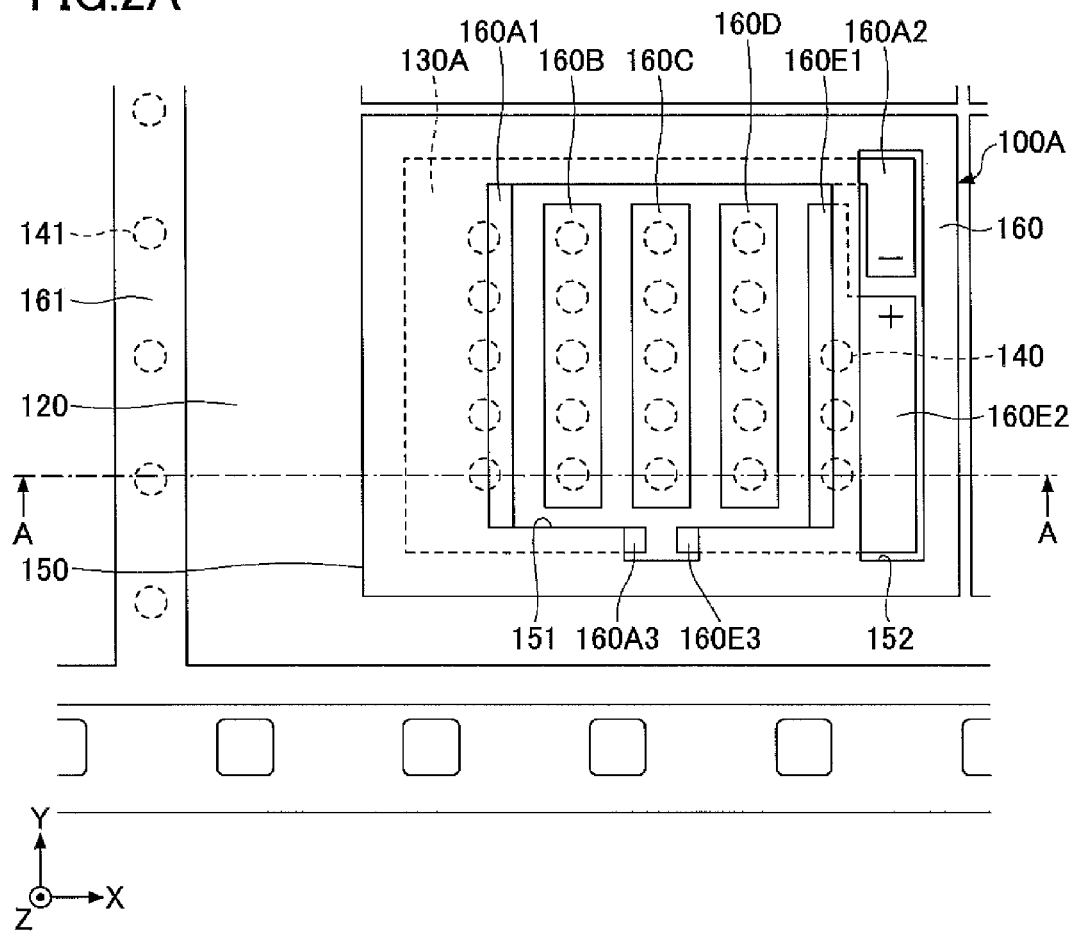
FIGS. 2A and 2B are enlarged views of an area illustrated with broken lines in FIG. 1.
Figure 2B:
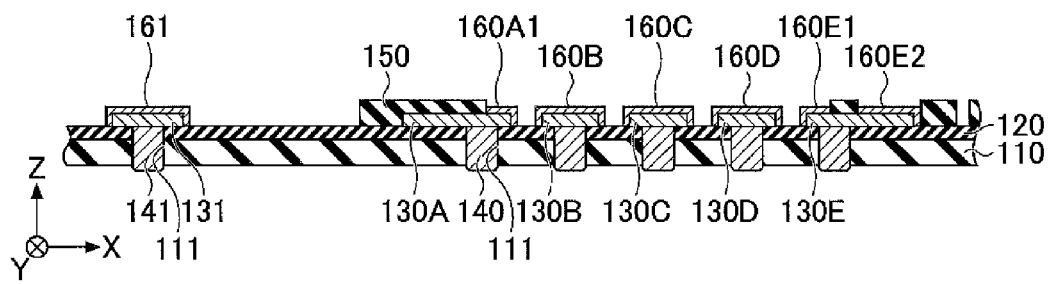
Figure 3:
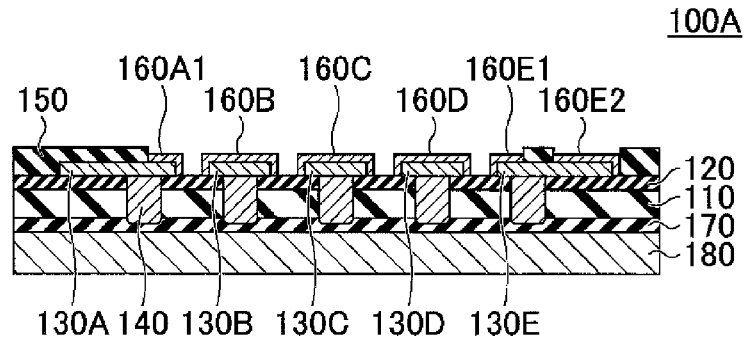
FIG. 3 is a cross-sectional view of a wiring substrate having a heat radiation plate attached thereto after singulation according to the first embodiment of the present invention.

FIG. 1 is a plan view illustrating a wiring substrate 100A according to a first embodiment of the present invention. FIGS. 2A and 2B are enlarged views of an area illustrated with broken lines in FIG. 1, in which FIG. 2A is a plan view of said area, and FIG. 22 is a cross-sectional view taken along line A-A of FIG. 2A. FIG. 3 is a cross-sectional view of the wiring substrate 100A having a heat radiation plate attached thereto after singulation. The cross section illustrated in FIG. 3 corresponds to FIG. 2B. In FIGS. 1-3, an XYZ coordinate system is defined.

As illustrated in FIGS. 1 and 2B, the wiring substrate 100 of the first embodiment includes a substrate 110, an adhesive layer 120, a wiring(s) 130 (130A, 130B, 130C, 130D, and 130E), a thermal conduction part(s) 140, an insulation layer 150, and a plating layer 160 (160A1, 160A2, 160A3, 160B, 160C, 160D, 160E1, 160E2, 160E3).

Further, the wiring substrate 100 also includes a bus line 131, a via 141, and a plating layer 161.

By performing singulation on the wiring substrate 100 along an outer frame of the insulation layer 150 illustrated in FIG. 1, nine wiring substrates 100A can be obtained. The wiring substrate 100A is a substrate having a rectangular shape from plan view.

After the singulation, a heat radiation plate 180 is attached to the wiring substrate 100A by way of an adhesive layer 170 as illustrated in FIG. 3.

According to the first embodiment, a tape-like object prior to being subjected to singulation (as illustrated in FIG. 1) is referred to as the wiring substrate 100. A substrate, prior to having attached the adhesive layer 170 and the heat radiation plate 180 but subsequent to being subjected to singulation, is referred to as the wiring substrate 100A. In addition, a substrate, subsequent to being subjected to singulation and having attached the adhesive layer 170 and the heat radiation plate 180, is also referred to as the wiring substrate 100A.

Further, in a case where the wirings 130A, 130B, 130C, 130D, and 130E are not particularly distinguished from each other, the wirings 130A, 130B, 130C, 130D, and 130E are collectively referred to as "wiring 130" or "wirings 130". Further, in a case where the plating layers 160A1, 160A2, 160A3, 160B, 160C, 160D, 160E1, 160E2, and 160E3 are not particularly distinguished from each other, the plating layers 160A1, 160A2, 160A3, 1603, 160C, 160D, 160E1, 160E2, and 160E3 are collectively referred to as "plating layer 160" or "plating layers 160".

It is preferable to use, for example, an insulation resin film such as polyimide tape as the substrate 110. A polyimide tape, which is an example of an insulation substrate, has a flexible property. Because polyimide tape is a tape-like film made of polyimide, polyimide tape is suitable for performing singulation after multiple wiring substrates 100A are manufactured.

However, insulation resin films other than polyimide tape may also be used for the substrate 110. For example, a film made of an epoxy type resin or a polyester type resin may be used as the substrate 110.

In FIG. 1, the tape-like substrate 110 extends in the X axis direction. Sprocket holes 110A are formed on both ends of the substrate 100 in the transverse direction (Y axis direction) of the substrate 100.

Further, the substrate 110 is not limited to an insulation substrate having a flexible property. For example, a substrate made of an FR4 (Flame Retardant 4) glass epoxy resin may be used as the substrate 110.

The thickness of the substrate 110 may be, for example, approximately 50 μm to 125 μm.

The adhesive layer 120 is adhered to a front surface (upper surface in FIG. 2B) of the substrate 110. The wiring 130 is adhered to the substrate 110 by way of the adhesive layer 120. For example, a heat resistant adhesive agent made of an insulation resin material (e.g., epoxy type adhesive agent, polyimide type adhesive agent) may be used as the adhesive layer 120. The thickness of the adhesive layer 120 may be, for example, approximately 8 μm to 12 μm.

The wiring 130 may be adhered to the front surface of the substrate 110 by way of the adhesive layer 120 to form a predetermined pattern (i.e. patterning).

The wiring 130A extends along the four sides of the rectangular-shaped wiring substrate 100A, to thereby form a shape similar to the letter C. The plating layers 160A2 and 160A3 are layered on both ends of the wiring 130A, respectively.

The wirings 130B, 130C, and 130O have an elongated or an oblong shape from plan view. The wirings 130B, 130C, and 130D are arranged in parallel with each other within a rectangular area surrounded by the wirings 130A and 130E. The wirings 130B, 130C, and 130D extend in the Y axis direction. The wirings 130B, 1300, and 130D are formed having long sides facing each other at predetermined intervals. That is, the wirings 130B, 130C, and 130D are arranged in parallel at predetermined intervals, so that a long side of the elongated part of one of the wirings 130B, 130C, 130D faces a corresponding long side of the elongated part of another one of the wirings 130B, 130C, and 130D.

The wiring 130E is a wiring having a shape of an inverted L. The wiring 130E and the 130A are arranged to form a rectangular shape. The wirings 130B, 130C, and 130D are arranged in the rectangular area surrounded by the wirings 130A, 130E.

In this embodiment, the thermal conduction parts 140 are connected to bottom surfaces of the wirings 130A-130E. The thermal conduction parts 140 are formed inside throughholes 111 of the substrate 110. Five thermal conduction parts 140 are connected to each of corresponding wirings 130A-130D. Three thermal conduction parts 140 are connected to the wiring 130E.

The wirings 130A-130E may be formed by, for example, patterning copper foil to the front surface of the substrate 110 by way of the adhesive layer 120.

The wiring 130A may have a maximum length of, for example, approximately 8.0 mm to 15.0 mm in the X axis direction. The wiring 130A may have a maximum length of, for example, approximately 6.0 mm to 10.0 mm in the Y axis direction. The wiring 130A may have a maximum width of, for example, approximately 2.0 mm to 3.0 mm. The wiring 130A may have a minimum width of, for example, approximately 0.5 mm to 1.0 mm. The wiring 130A may have a thickness of, for example, approximately 18 μm to 35 μm.

Each of the wirings 130B-130D may have a length of, for example, approximately 5.0 mm to 10.0 mm in its longitudinal direction. Each of the wirings 130B-130D may have a width of, for example, approximately 0.5 mm to 1.0 mm. Each of the wirings 130B-130D may have a thickness of, for example, approximately 18 μm to 35 μm.

The wiring 130E may have a maximum length of, for example, approximately 3.0 mm to 8.0 mm in the X axis direction. The wiring 130E may have a maximum length of, for example, approximately 5.0 mm to 9.0 mm in the Y axis direction. The wiring 130E may have a maximum width of, for example, approximately 2.0 mm to 3.0 mm. The wiring 130E may have a minimum width of, for example, approximately 0.5 mm to 1.0 mm. The wiring 130E may have a thickness of, for example, approximately 18 μm to 35 μm.

The bus line 131 is a wiring to be used as a power feeding line when forming the plating layer 160. The bus line 131 is formed to surround the nine wiring substrates 100A, in a plan view, prior to singulation.

Similar to the wirings 130A-130E, the bus line 131 may be formed by patterning copper foil to the front surface of the substrate 110 by way of the adhesive layer 120. The bus line 131 may be formed substantially simultaneously with the forming of the wirings 130A-130E.

The via 141 is connected to a bottom surface of the bus line 131. The plating layer 161 is formed on a top surface of the bus line 131. Similar to the thermal conduction part 140, the via 141 is formed inside the through-hole 111 of the substrate 110.

The thermal conduction part 140 is a conduction part having a column-like (post-like) shape. The thermal conduction part 140 is formed inside the through-hole 111 of the substrate 110 that penetrates the substrate 110 from the front surface of the substrate 110 to the rear surface of the substrate 110. The thermal conduction part 140 is an example of a first via used for releasing heat (thermal via). The through-hole 111 in which the thermal conduction part 140 is formed also penetrates the adhesive layer 120. In other words, the thermal conduction part 140 not only penetrates the substrate 110 but also penetrates the adhesive layer 120. A top end of the thermal conduction part 140 is connected to the wiring 130. A bottom end of the thermal conduction part 140 is connected to the heat radiation plate 180 interposed by the adhesive layer

170. The thermal conduction part 140 has a circular shape from plan view. That is, the thermal conduction part 140 is a conduction part having a circular column-like shape.

For example, a column-like copper material may be used as the thermal conduction part 140. The thermal conduction part 140 may be manufactured by feeding power to the wiring 130 prior to patterning the wiring 130 and growing a metal plating inside the through-hole 111 of the substrate 110 by using an electroplating process. The diameter of the thermal conduction part 140 may be, for example, approximately 0.2 mm to 0.8 mm. The plan-view shape of the thermal conduction part 140 is not limited to a circular shape. For example, the thermal conduction part 140 may have an elliptical shape, a rectangular shape, or a polygon shape from plan view. Accordingly, the thermal conduction part 140 is not limited to a circular column-like shape. For example, the thermal conduction part 140 may have a rectangular column-like shape or a polygonal column-like shape.

The thermal conduction part 140 has one end (top end of the thermal conduction part 140 in FIG. 3) connected to the wiring 130 and another end (bottom end of the thermal conduction part 140 in FIG. 3) exposed from the rear surface of the substrate 110. In the example illustrated in FIG. 3, the other end of the thermal conduction part 140 (bottom end of the thermal conduction part 140 in FIG. 3) projects from the rear surface of the substrate 110 and faces the heat radiation plate 180 interposed by the adhesive layer 170.

The other end of the thermal conduction part 140 (bottom end of the thermal conduction part 140 in FIG. 3) may be substantially flush with the rear surface of the substrate 110 or offset (recessed) more toward the inside of the through-hole 111 than the rear surface of the substrate 110.

Similar to the thermal conduction part 140, the via 141 is a conduction part having a column-like (post-like) shape. The via 141 is formed inside the through-hole 111 of the substrate 110 that penetrates the substrate 110 from the front surface of the substrate 110 to the rear surface of the substrate 110. The via 141 is an example of a second via.

The through-hole 111 in which the via 141 is formed also penetrates the adhesive layer 120. In other words, the via 141 not only penetrates the substrate 110 but also penetrates the adhesive layer 120. A top end of the via 141 is connected to the bus line 131. The via 141 has a circular shape from plan view.

For example, a column-like copper material may be used as the via 141. The via 141 may be manufactured by feeding power to the bus line 131 prior to patterning the bus line 131 and growing a metal plating inside the through-hole 111 of the substrate 110 by using an electroplating process. The via 141 may be formed with the same size as the above-described size of the thermal conduction part 140. Alternatively, the via 141 may be formed with a size that is different from the size of the thermal conduction part 140.

The insulation layer 150 is formed to cover a part of the front surface (upper surface in FIG. 2B) of the adhesive layer 120 that is not covered by the wiring 130. Further, the insulation layer 150 is formed to cover a part of the front surface (upper surface in FIG. 2B) of the wiring 130 that is not covered by the plating layer 160.

For example, in a case of mounting an electronic component (e.g., LED) having an illuminating property and a heat generating property where the plating layer 160 of the first embodiment is used as an electrode, a white insulation resin can be used for the insulation layer 150. This is because the reflectivity and the heat release rate of the insulation layer 150 can be improved by using an insulation resin having a white color, and the illuminance and the heat release rate of the below-described LED 190 can be improved. In other words, the insulation layer 150, in this case, functions as a reflection film.

The insulation resin used for the insulation layer 150 may be, for example, an epoxy type resin or a silicone type resin (e.g., organopolysiloxane) containing a filler or a pigment such as titanium oxide ($TiO_2$) or barium sulfate ($BaSO_4$). Alternatively, the insulation resin of the insulation layer 150 may be a white color ink made of an epoxy type resin or a silicone type resin (e.g., organopolysiloxane) containing a filler or a pigment such as titanium oxide ($TiO_2$) or barium sulfate ($BaSO_4$).

The insulation layer 150 includes an outer frame having a rectangular shape from plan view. Opening parts 151 and 152 are formed in the insulation layer 150.

The insulation layer 150 is formed to insulate at least the part of the front surface (upper surface in FIG. 2B) of the wiring 130 on which the plating layer 160 (160A1, 160A2, 160A3, 160B, 160C, 160D, 160E1, 160E2, and 160E3 in FIG. 2B) is not formed.

The plating layers 160A1, 160A3, 160B, 160C, 160D, 160E1, and 160E3 are exposed from the opening part 151 of the insulation layer 150. The plating layers 160A2 and 160E2 are exposed from the opening part 152 of the insulation layer 150.

Various types of insulation layers besides the white ink layer may be used as the insulation layer 150 according to the type of electronic component connected to the plating layers 160A1, 160B, 160C, 160D, and 160E1.

The insulation layer 150 is formed before forming the plating layer 160. More specifically, the insulation layer 150 is formed to expose an area of the wiring 130 on which the plating layer 160 is formed in a process subsequent to the forming of the insulation layer 150.

The plating layers 160A1, 160A2, 160A3, 160B, 160C, 160D, 160E1, 160E2, and 160E3 are formed on a part of the front surface of the wiring 130 that is not covered by the insulation layer 150.

More specifically, the plating layer 160A1, 160A2, and 160A3 are formed on a part of the front surface of the wiring 130A. The plating layer 160B, 160C, and 160D are formed on the entire front surface of the wirings 130B, 130C, and 130D, respectively. The plating layers 160E1, 160E2, and 160E3 are formed on a part of the wiring 130E.

Among the aforementioned plating layers, the plating layers 160A1, 160B, 160C, 160D, and 160E1 are used as electrodes to be connected to corresponding terminals of an electronic component(s).

For example, positive terminals and negative terminals of electronic components are alternately connected to the plating layers 160A1, 160B, 160C, 160D, and 160E1. In one illustrative case, a negative terminal of a first electronic component is connected to the plating layer 160A1, and a positive terminal of the first electronic component is connected to a left side of the plating layer 160B. Further, a negative terminal of a second electronic component is connected to a right side of the plating layer 160B, and a positive terminal of the second electronic component is connected to a left side of the plating layer 160C. Further, a negative terminal of a third electronic component is connected to a right side of the plating layer 160C, and a positive terminal of the third electronic component is connected to a left side of the plating layer 160D. Further, a negative terminal of a fourth electronic component is connected to a right side of the plating layer 160D, and a positive terminal of the electronic component is connected to the plating layer 160E1.

In this illustrative case, the plating layer 160A2 is connected to a negative terminal (−) of a direct-current (DC) power source whereas the plating layer 160E2 is connected to a positive terminal (+) of the direct-current power source.

By connecting the positive terminals and the negative terminals of the electronic components to the plating layers 160A1, 160B, 160C, 160D, and 160E1 in the above-described manner, four electronic components can be serially connected to the direct-current power source.

The adhesive layer 170 is adhered to the rear surface (lower surface in FIG. 2B) of the substrate 110. The adhesive layer 170 adheres the heat radiation plate 180 and the substrate 110 together. It is preferable to use a material having high thermal conductivity as the adhesive layer 170. For example, the material of the adhesive layer 170 may be a heat releasing adhesive agent having a filler (e.g., alumina) contained inside an insulation resin such as an epoxy type resin or a polyimide type resin.

The heat radiation plate 180 is a heat spreader adhered to the rear surface of the substrate 110 by way of the adhesive layer 170. For example, a metal plate made of a metal material such as aluminum or copper may be used as the heat radiation plate 180. Alternatively, a plate made of a ceramic material (e.g., alumina, aluminum nitride) may be used as the heat radiation plate 180. Alternatively, an insulation plate made of a material having high thermal conductivity (e.g., silicon) may be used as the heat radiation plate 180.

Figure 4:
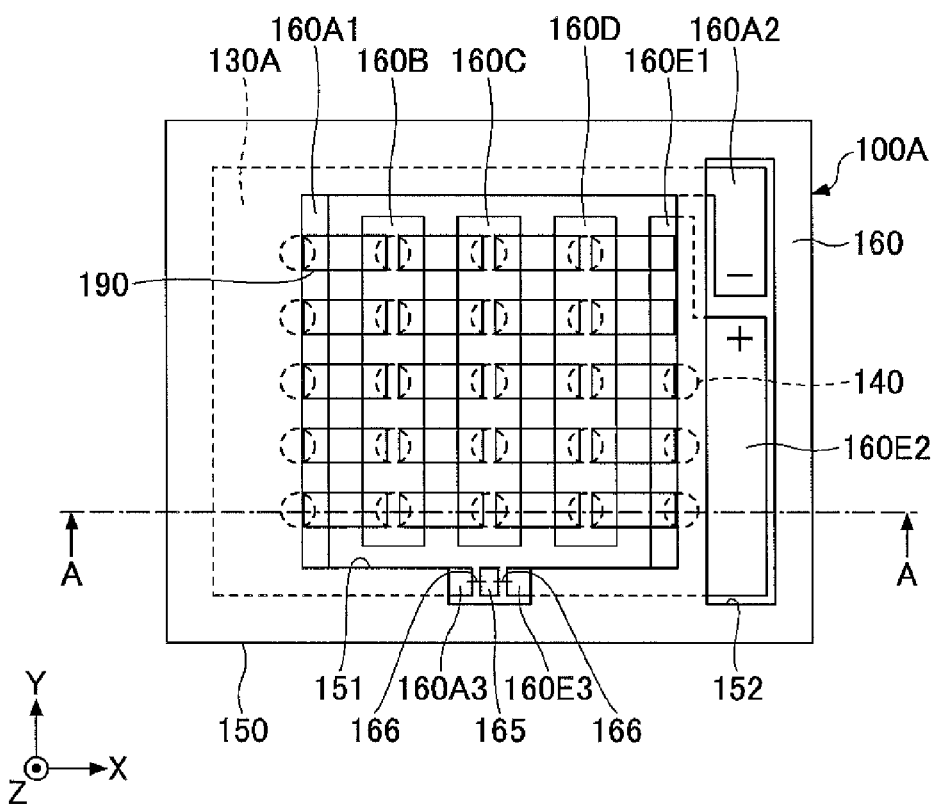
FIGS. 4 and 5 are schematic diagrams illustrating a state where LEDs are mounted on a wiring substrate according to the first embodiment of the present invention.
Figure 5:
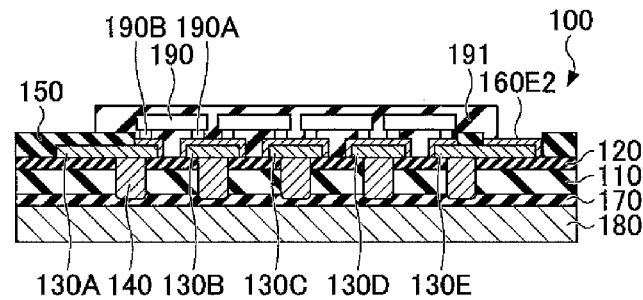

FIGS. 4 and 5 illustrate a state of an illumination apparatus obtained by mounting LEDs 190 on the above-described wiring substrate 100A of the first embodiment. FIGS. 4 and 5 are schematic diagrams illustrating a state where LEDs 190 are mounted on the wiring substrate 100A of the first embodiment. FIG. 5 is a cross-sectional view taken along line A-A of FIG. 4.

As illustrated in FIG. 4, twenty LEDs 190 are connected to the plating layers 160A1, 160B, 160C, 160C, 160D, and 160E1. A zener diode 165 is provided between the plating layer 160A3 and the plating layer 160E3. The zener diode 165 is connected to the plating layers 160A3 and 160E3 by way of a bonding wire 166.

As illustrated in FIG. 5 (i.e. cross-section taken along line A-A of FIG. 4), four LEDs 190 are connected to the plating layers 160A1, 160B, 160C, 160D, and 160E. The LED 190 includes electrodes (not illustrated) that are connected to terminals 190A and 190B. The terminals 190A, 190B may be solder or bumps formed of, for example, gold. The LEDs 190 are connected to the wiring (wiring layer) 130 by way of the plating layers 160A1, 160B, 160C, 160C, 160E1, and the terminals 190A, 190B.

The terminal 190A and the terminal 190B of the four LEDs 190 are connected to the plating layers 160A1, 160B, 160C, 160D, and 160E1, respectively. The plating layers 160A1, 160B, 160C, 160D, and 160E1 may be connected to the terminals 190A and 190B, for example, by soldering.

The LEDs 190 are encapsulated by a encapsulating resin 191. The encapsulating resin 191 is formed of, for example, a fluorescent material. The quality of the fluorescent material of the encapsulating resin 191 may be determined depending on the relationship with respect to the illumination color of the LED 190. For example, in a case of an illumination apparatus having a blue LED (LED emitting blue light) 190 and the encapsulating resin 191 mounted on the wiring substrate 100, a green or a red fluorescent material is to be used as the material of the encapsulating resin 191 if illumination of white light is desired.

For example, a silicone type resin or an epoxy type resin containing a fluorescent substance may be used as the material of the encapsulating resin 191. The LEDs 190 can be encapsulated by performing molding or potting on the LEDs 190 with the above-described encapsulating resin 191.

The thermal conduction part 140 may be provided immediately below a part of the wiring 130 connected to at least one of the terminals 190A, 190B of the LED 190. That is, the thermal conduction part 140 may be provided immediately below a part of the plating layer 160. Thereby, a heat releasing path can be shortened and improve heat releasing performance.

It is, however, to be noted that the position of the thermal conduction part 140 is not limited to the position immediately below the part of the wiring 130 connected to at least one of the terminals 190A, 190B of the LED 190 (immediately below the part of the plating layer 160).

Although FIG. 5 illustrates four LEDs 190 being integrally encapsulated by the encapsulating resin 191, the LEDs 190 may be encapsulated separately by the encapsulating resin 191. Alternatively, the LEDs 190 may be sorted into a number of groups and encapsulated in units of groups by the encapsulating resin 191.

As illustrated in the below-described FIGS. 6A and 6B, the thermal conduction part 140 may be processed to be offset more toward the inside of the through-hole 111 than the rear surface of the substrate 110.

Figure 6A:
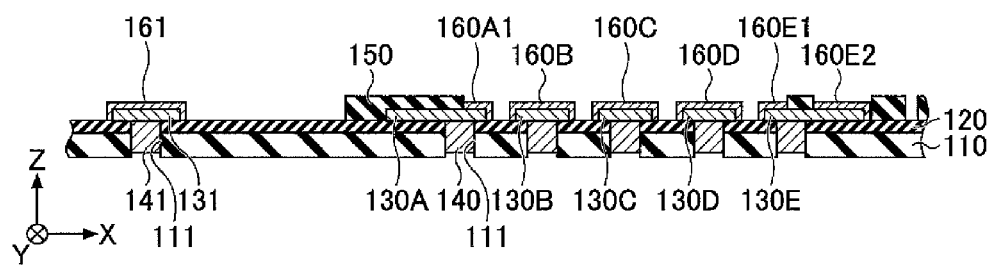
FIGS. 6A and 6B are schematic diagrams for describing a modified example of a wiring substrate according to the first embodiment of the present invention.
Figure 6B:
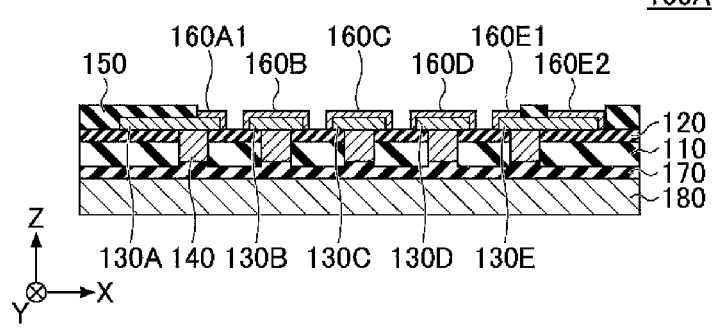

FIGS. 6A and 6B are schematic diagrams for describing a modified example of the wiring substrate 100 of the first embodiment. FIG. 6A is a cross-sectional view illustrating the modified example of the wiring substrate 100 of the first embodiment. FIG. 6B is a cross-sectional view illustrating a state where the heat radiation plate 180 is attached to the modified example of wiring substrate 100 of the first embodiment.

As illustrated in FIG. 6A, the thermal conduction part 140 is offset (recessed) more toward the inside of the through-hole 111 than the rear surface (lower surface in FIG. 6A) of the wiring substrate 100, so that the thermal conduction part 140 is accommodated in the through-hole 111. After forming the thermal conduction part 140 that protrudes from the rear surface of the substrate 110 in a negative direction of the Z axis and forming the plating layer 160 on the wiring 130, the thermal conduction part 140 can be accommodated inside the through-hole 111 (as illustrated in FIG. 6) by removing the bottom end of the thermal conduction part 140. The bottom end of the thermal conduction part 140 may be removed by, for example, polishing or etching. Although FIG. 6A illustrates a state where the bottom end of the via 141 is also removed, the bottom end of the via 141 may remain without being removed.

After removing the bottom end of the thermal conduction part 140 to accommodate the thermal conduction part 140 inside the through-hole 111 of the substrate 110, and performing singulation, the heat radiation plate 180 may be attached to the substrate 110 by way of the adhesive layer 170.

Next, a method for manufacturing the wiring substrate 100 of the first embodiment is described with reference to FIGS. 7A to 12D.

FIGS. 7A to 12D are schematic diagrams illustrating processes for manufacturing the wiring substrate 100 of the first embodiment.

The cross sections of a wiring substrate 100A illustrated in FIGS. 7A to 9E correspond to the cross section illustrated in FIG. 2B. The longitudinal direction of the substrate 110 formed of a polyimide film corresponds to the X axis direction.

Figure 7A:
FIGS. 7A to 12D are schematic diagrams illustrating processes for manufacturing a wiring substrate according to the first embodiment of the present invention.

First, as illustrated in FIG. 7A, the adhesive layer 120 is formed on the front surface (upper surface in FIG. 7A) of the substrate 110 by applying an adhesive agent on the front surface of the substrate 110. Alternatively, an adhesive film may be used instead of the adhesive agent.

For example, the wiring substrate 100 may be manufactured by using a reel-to-reel method that uses a polyimide insulation resin tape as a base material. Thus, in this case, the substrate 110 of FIG. 7A is a partial cross section of a tape-like substrate 113 described below in FIG. 9D.

Figure 7B:

Then, as illustrated in FIG. 7B, five through-holes 111A and one through-hole 111B are formed by a punching process. The five through-holes 111A and one through-hole 111B penetrate both the substrate 110 and the adhesive layer 120. It is to be noted that the sprocket holes 110A (see FIG. 1) are also formed substantially at the same time as performing the process of FIG. 7B.

Figure 7C:
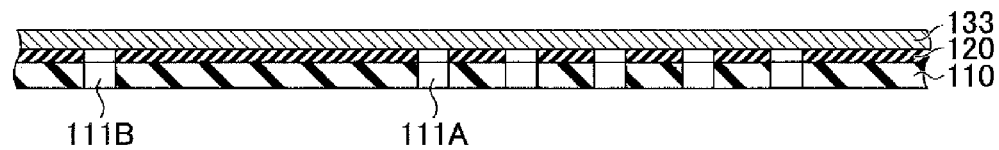

Then, as illustrated in FIG. 7C, copper foil 133 is adhered onto the adhesive layer 120. The copper foil 133 may have a thickness of, for example, approximately 18 µm to 35 µm. By the below-described patterning process, the copper foil 133 becomes the wiring 130 and the bus line 131.

Figure 7D:
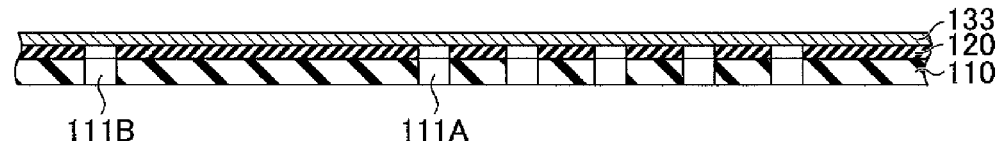

Then, as illustrated in FIG. 7D, a lower surface of the copper foil 133 that faces the through-holes 111A, 111B and an upper surface of the copper foil 133 are etched by impregnation in a solution for wet-etching. By the etching process, a preservative remaining on the front surface of the copper foil 133 is removed together with a slight portion (e.g., 1 µm to 2 µm in the thickness direction of the copper foil 133) of the front surface of the copper foil 133. The etching process is performed according to necessity. That is, the etching process need not be always performed.

Figure 8A:
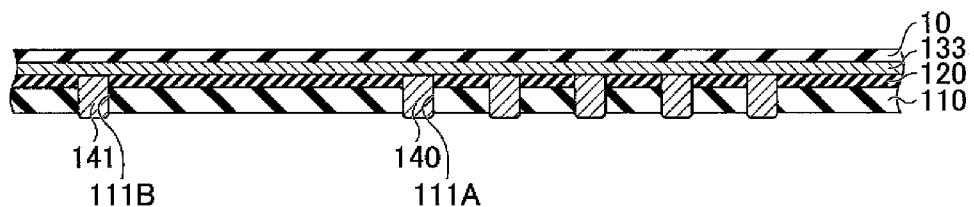

Then, as illustrated in FIG. 8A, a masking tape 10 is adhered onto the upper surface of the copper foil 133, and the thermal conduction part 140 and the via 141 are grown by performing an electroplating process in which power is fed from the copper foil 133. The thermal conduction part 140 is formed in the through-hole 111A by depositing a metal plating on the rear surface of the copper foil 133 exposed from the through-hole 111A, and the via 141 is formed in the through-hole 111B by depositing a metal plating on the rear surface of the copper foil exposed from the through-hole 111B. Thereby, the thermal conduction part 140 and the via 141 are formed into column-like shapes in the through-holes 11A, 11B, respectively. In a state before the forming of the thermal conduction part 140 and the via 141, the top ends of the through-holes 111A, 1112 are closed by the copper foil 133.

By filling the insides of the through-holes 111A, 1112 with the metal plating, the forming of the column-like thermal conduction parts 140 and vias 141 is completed. For example, the thermal conduction part 140 and the via 141 may be formed by using an electroplating method. With the electroplating method, the thermal conduction part 140 and the via 141 are formed by depositing a copper plating on the rear surface of the copper foil 133 and filling the inside of the through-holes 111A, 111B with the copper plating.

Because the through-holes 111A, 111B penetrate both the substrate 110 and the adhesive layer 120 and expose the rear surface of the copper foil 133, the thermal conduction part 140 and the via 141 are formed in column-like shapes penetrating both the substrate 110 and the adhesive layer 120.

One end (top end in FIG. 8A) of the thermal conduction part 140 is connected to the copper foil 133, and another end (bottom end in FIG. 8A) is exposed from the rear surface of the substrate 110. Similarly, one end (top end in FIG. 8A) of the via 141 is connected to the copper foil 133, and another end (bottom end in FIG. 8A) is exposed from the rear surface of the substrate 110. In the example illustrated in FIG. 8A, the other end (bottom end of FIG. 8A) of the thermal conduction part 140 and the other end (bottom end of FIG. 8A) of the via 141 are formed to protrude from the rear surface of the substrate 110.

The masking tape 10 covers the upper surface of the copper foil 133 for preventing a copper layer on the upper surface of the copper foil 133 from growing during the process of growing the thermal conduction part 140 and the via 141 with the electroplating method. It is to be noted that the electroplating method (process) is performed by feeding power to the copper foil 133.

Figure 8B:
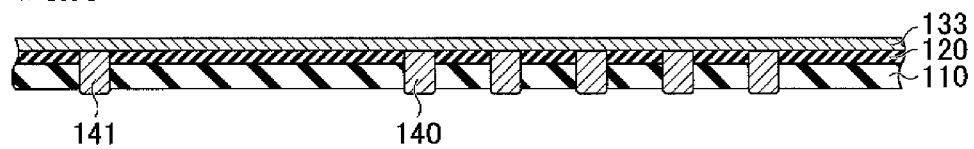

Then, as illustrated in FIG. 8B, the masking tape 10 is removed.

Figure 8C:
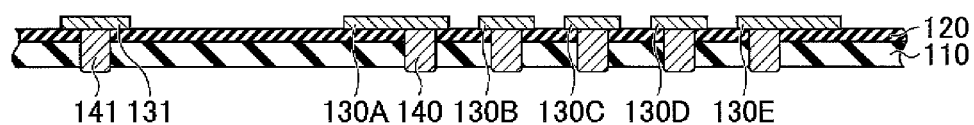

Then, resist is applied onto the copper foil 133 and exposed in accordance with the pattern of the wiring 130, to thereby develop the pattern of the wiring 130. Then, as illustrated in FIG. 8C, the wiring 130 and the bus line 131 are formed by using the resist to etch target areas of the copper foil 133 (patterning). It is to be noted that FIG. 8C illustrates a state after the resist is removed after the patterning of the wiring 130 is completed.

Figure 8D:
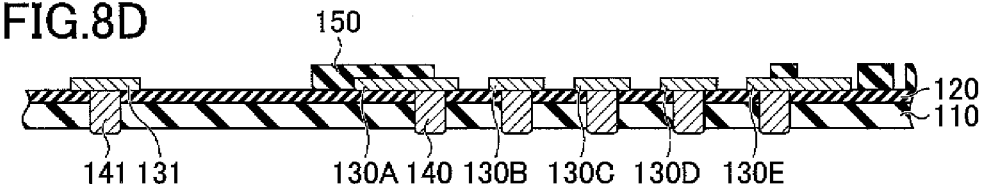

Then, as illustrated in FIG. 8D, the insulation layer 150 is formed on a predetermined part of the wiring 130. The predetermined part of the wiring 130 is located within a singulated wiring substrate 100A and is an area in which the plating layer 160 is not formed in a subsequent process. For example, in a case where a white ink layer is to be used as the insulation layer 150, the insulation layer 150 may be formed by a screen printing method. In a case where an insulation layer besides the white ink layer is to be used as the insulation layer 150, the screen printing method or the like may be used to form the insulation layer 150.

Further, in a case where another method besides the screen printing method is used to form the insulation layer 150 to cover the wiring 130, the opening parts 151, 152 (see, for example, FIG. 2A), exposing a part of the wiring 130 on which the plating layer 160 is formed, may be formed in the insulation layer 150 after forming the insulation layer 150.

Figure 9A:
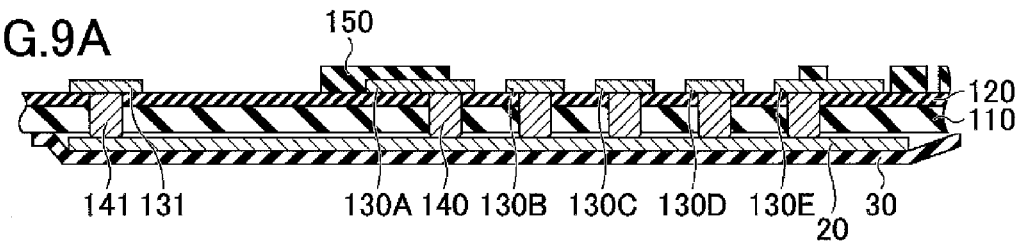

Then, as illustrated in FIG. 9A, a masking tape 30 attached with a copper foil 20 is adhered to a lower side of the substrate 110. Thereby, the copper foil 20 contacts the bottom end of the thermal conduction part 140 and the bottom end of the via 141. In the state illustrated in FIG. 9A, the lower side of the substrate 110 is to be completely covered by the masking tape 30.

Then, power is fed to the bus line 131. In this state where power is fed to the bus line 131, the bus line 131 is connected to the wirings 130A-130E by way of the copper foil 20. Therefore, power can also be fed to the wirings 130A-130E by feeding power to the bus line 131.

Figure 9B:
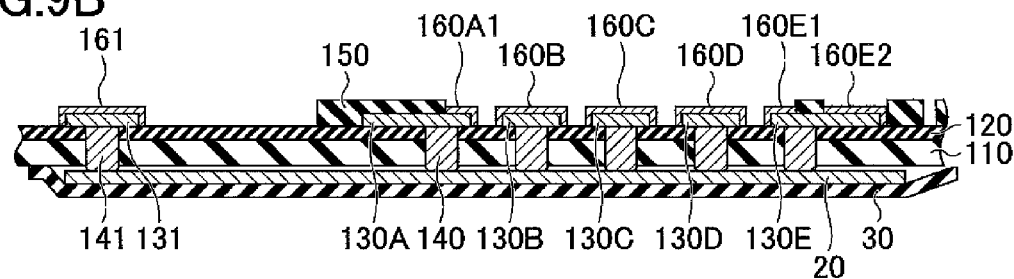
Figure 9C:
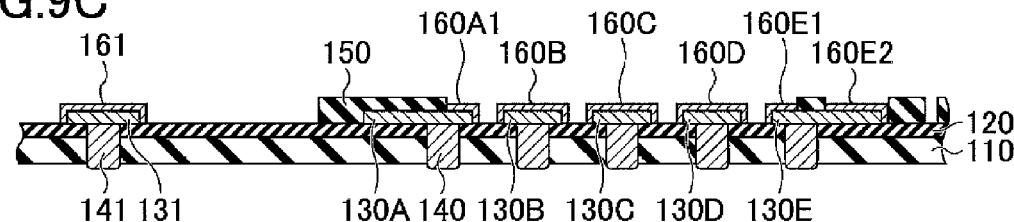

Accordingly, by performing an electroplating process while feeding power to all of the wirings 130A-130E by way of the bus line 131 in the state illustrated in FIG. 9A, the plating layers 160A1, 160A2, 160A3, 160B, 160C, 160D, 160E1, 160E2, and 160E3 can be formed as illustrated in FIG. 9B.

The plating layers 160A1, 160A2, 160A3, 1603, 160C, 160D, 160E1, 160E2, and 160E3 may be formed by, for example, layering a nickel (Ni) layer and a gold (Au) layer on the wiring 130 in this order. However, other materials may also be used as the plating layers 160A1, 160A2, 160A3, 160B, 160C, 160D, 160E1, 160E2, and 160E3. For example, a nickel (Ni) layer, a palladium (Pd) layer, and a gold (Au) layer may be layered on the wiring 130 in this order. Alternatively, a nickel (Ni) layer and a silver (Ag) layer may be layered on the wiring 130 in this order.

It is to be noted that the same plating layer 161 as the plating layer 160 is formed on the bus line 131 when the plating layer 160 is being formed.

Then, as illustrated in FIG. 9O, the masking tape 30 attached with the copper foil 20 is removed. Thereby, the manufacturing of the wiring substrate 100A of FIG. 2B is completed.

Figure 9D:
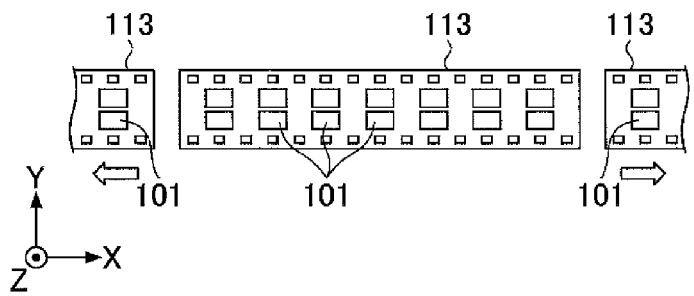

Then, as illustrated in FIG. 9D, the tape-like substrate 113 such as a polyimide tape is cut in a longitudinal direction of the tape-like substrate 113. The tape-like substrate 113 substantially corresponds to the substrate 110 of FIG. 1 formed into a tape-like configuration.

In FIG. 9D, reference numeral 101 indicates a wiring part that is to become a single wiring substrate 100A. In FIG. 9D and the drawings following FIG. 9D, it is assumed that two wiring parts 101 are arranged in the Y axis direction. In the process of FIG. 9D, the tape-like substrate 113 is cut, so that 14 wiring parts 101 are included in the cut tape-like substrate 113.

Figure 9E:
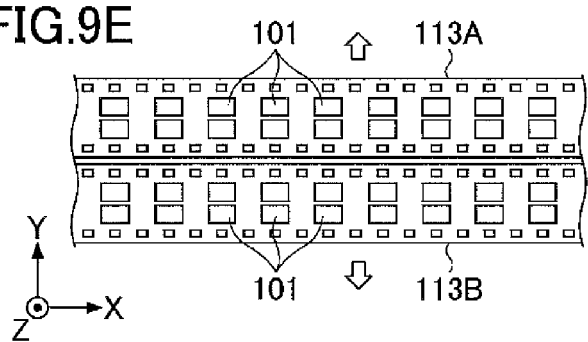

As illustrated in FIG. 9E, in a case where the tape-like substrate 113 is formed of four lines of wiring parts 101 in the width direction of the tape-like substrate 113, the tape-like substrate 113 may be divided into tape-like substrates 113A and 113B. Then, similar to the process of FIG. 9O, the tape-like substrates 113A and 113E may be cut in the longitudinal direction of the tape-like substrates 113A and 113B, respectively.

Figure 10A:
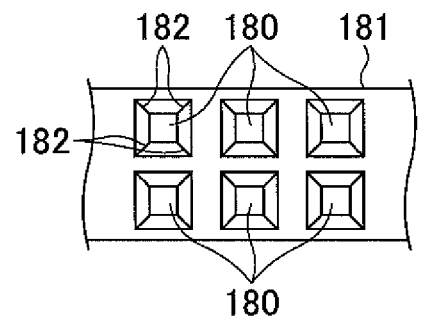

Then, as illustrated in FIG. 10A, a frame 181 including multiple heat radiation plates 180 is prepared. Four corners of each heat radiation plate 180 are hung on the frame 181 by way of linear connection parts 182. The frame 181 is formed by performing a punching process or an etching process on a hoop-like metal material.

FIG. 10A illustrates only a part of the frame 181 in a longitudinal direction of the frame 181 (part of the frame 181 in which six heat radiation plates 180 are formed). However, the actual frame 181 is long in the left/right directions in correspondence with the tape-like substrate 113 (see, for example, FIG. 9D).

Figure 10B:
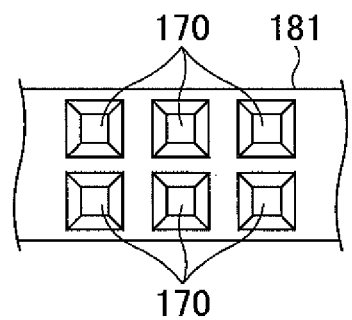

Then, as illustrated in FIG. 10B, the adhesive layer 170 is formed by applying, for example, an adhesive paste or an adhesive liquid to each heat radiation plate 180 formed on the frame 181. Then, as illustrated in FIG. 10O, the tape-like substrate 113 is adhered onto the frame 181. In the process of FIG. 10O, each adhesive layer 170 adheres corresponding heat radiation plate 180 and the tape-like substrate 113. Alternatively, in forming the adhesive layer 170, an adhesive film may be laminated instead of applying the adhesive paste or adhesive liquid.

It is to be noted that, the adhesive layer 120, the wiring 130, the thermal conduction part 140, the insulation layer 150, and the plating layer 160 (see, for example, FIGS. 2A and 2B) are formed on the tape-like substrate 113.

After the process in FIG. 10O is finished, a singulation process (e.g., punching process, dicing process) is performed on the tape-like substrate 113. Thereby, multiple singulated wiring substrates 100A can be shipped in a state illustrated FIG. 3. In this singulation process, the connection parts 182 may be cut off from the frame 181.

Alternatively, multiple wiring parts 101 may be shipped in a sheet-like state by omitting the singulation process.

Figure 10C:
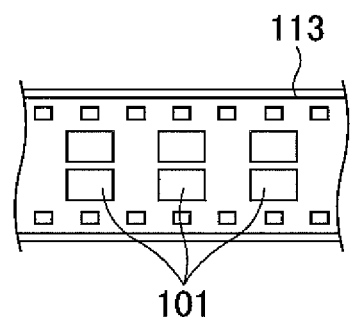

In the example illustrated in FIGS. 10A-10C, the tape-like substrate 113 and the heat radiation plate 180 are adhered by way of the adhesive layer 170 in a state where the adhesive layer 170 is formed on the heat radiation plate 180 beforehand. Alternatively, the adhesive layer 170 may be formed on the tape-like substrate 113 beforehand instead of the heat radiation plate 180.

Figure 11A:
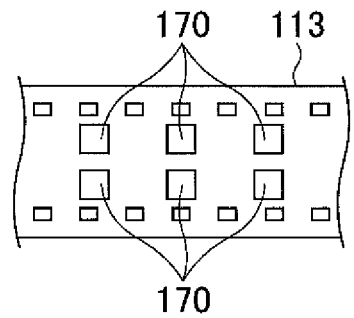

As illustrated in FIG. 11A, adhesive layers 170 may be formed on the rear surface of the tape-like substrate 113 beforehand. Then, as illustrated in FIG. 11C, the frame 181 may be adhered to the rear surface of the tape-like substrate 113 on which the adhesive layers 170 are formed. The adhesive layers 170 may be formed in areas of the rear surface of the tape-like surface 113 in correspondence with positions of corresponding wiring parts 101 (see, for example, FIG. 10C).

Figure 11B:
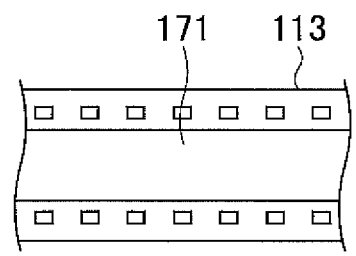
Figure 11C:
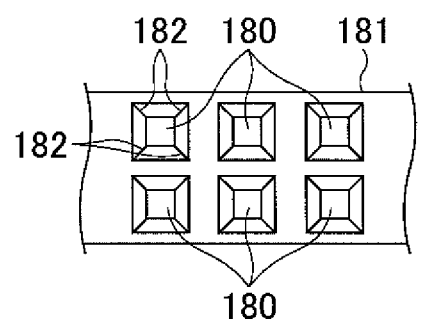

Further, as illustrated in FIG. 11B, a tape-like adhesive layer 171 may be formed on the rear surface of the tape-like substrate 113 on which the adhesive layers 170 are formed. Then, as illustrated in FIG. 11C, the frame 181 may be formed on the rear surface of the tape-like substrate 113 by way of the tape-like adhesive layer 171. Alternatively, an adhesive agent may used instead of the tape-like adhesive layer 171.

Further, as illustrated in FIGS. 12A-12D, the heat radiation plates 180, which are singulated beforehand, may be adhered to the rear surface of the tape-like substrate 113.

Figure 12A:
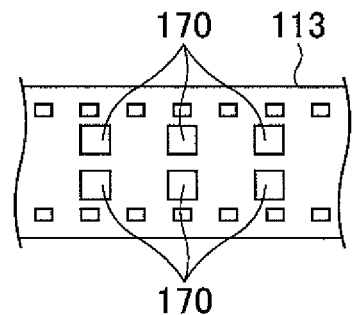
Figure 12B:
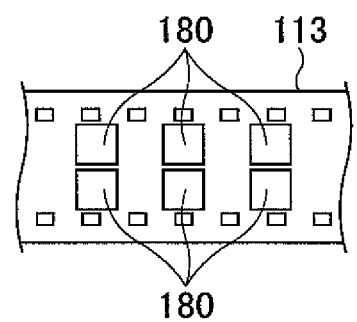

That is, as illustrated in FIG. 12A, first, adhesive layers 170 are formed on the rear surface of the tape-like substrate 113. Then, as illustrated in FIG. 12B, heat radiation plates 180 are formed on the rear surface of the tape-like substrate 113 on which the adhesive layers 170 are formed. The adhesive layers 170 may be formed in areas of the rear surface of the tape-like surface 113 in correspondence with positions of corresponding wiring parts 101 (see, for example, FIG. 10C).

Figure 12C:
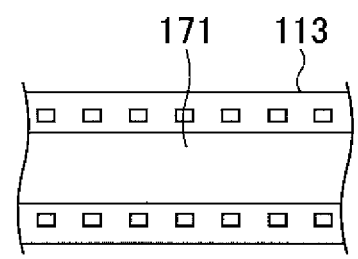
Figure 12D:
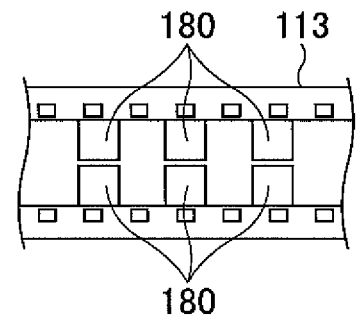

Further, as illustrated in FIG. 12C, the tape-like adhesive layer 171 may be formed on the rear surface of the tape-like substrate 113 on which the adhesive layers 170 are formed. Then, as illustrated in FIG. 12D, the heat radiation plates 180 may be formed on the rear surface of the tape-like substrate 113 by way of the tape-like adhesive layer 171. Alternatively, an adhesive agent may be used instead of the tape-like adhesive layer 171.

By performing singulation (e.g., punching process, dicing process) after the processes of FIGS. 12B and 12D, multiple singulated wiring substrates 100A can be shipped in a state illustrated in FIGS. 1-3.

Alternatively, multiple wiring parts 101 may be shipped in a sheet-like state by omitting the singulation process.

Accordingly, manufacturing of the wiring substrate 100A of the first embodiment is completed.

The wiring substrate 100A of the first embodiment has the wiring 130 and the heat radiation plate 180 thermally connected to each other by way of the heat conduction part 140. Because the thermal conduction part 140 is formed of copper, significantly high thermal conductivity can be achieved compared to the substrate 110 made of polyimide. Further, because the adhesive layer 170, which connects the bottom end of the thermal conduction part 140 and the heat radiation plate 180, is an adhesive agent having high thermal conductivity, thermal resistance between the thermal conduction part 140 and the heat radiation plate 180 can be reduced.

Accordingly, even in a case where the LED 190 is used in a state connected to the plating layer 160, the heat generated by the LED 190 can be efficiently transferred from the plating layer 160 to the heat radiation plate 180 by way of the thermal conduction part 140. Thereby, the heat releasing property of the wiring substrate 100A can be significantly improved.

In other words, the heat generated from an electronic component connected to one surface of the substrate 110 can be efficiently transferred to the heat radiation plate 180 provided on the other surface of the substrate 110 opposite to the one surface of the substrate 110.

Accordingly, with the above-described first embodiment of the present invention, there can be provided a wiring substrate 100A that can efficiently transfer heat generated by an electronic component connected to one surface of the substrate 110 to the heat radiation plate 180 provided on the other surface of the substrate 110 opposite to the one surface of the substrate 110, and significantly improve heat releasing property.

Further, in the wiring substrate 100A of the first embodiment, the wiring 130 and the bus line 131 are separated from each other. Further, the electroplating process for forming the plating layer 160 is performed by feeding power from the bus line 131 to the wiring 130 by way of the via 141, the copper foil 20, and the thermal conduction part 140 in a state where the copper foil 20 is in contact with the bottom end of the thermal conduction part 140 and the bottom end of the via 141.

Therefore, after singulation of the wiring substrate 100, metal members such as the wiring 130 can be prevented from projecting from the insulation layer 150 of the singulated wiring substrate 100A.

Instead of feeding power to the wiring 130 from the bus line 131 (positioned away from the wiring 130) by way of the copper foil 20 (see, for example, FIGS. 9A and 9B), it is assumed that the wiring 130 and the bus line 131 are connected to each other on the front surface of the substrate 110 by way of an additional wiring(s) and power is fed from the bus line 131 to the wiring 130 by the additional wiring (described in detail in comparative example below). In this case, in order for the wiring 130 and the bus line 131 to be connected by the additional wiring, the insulation layer 150 is to be penetrated by the additional wiring.

Due to this configuration in which the wiring 130 and the bus line 131 are connected on the front surface of the substrate 110 by the additional wiring, the additional wiring penetrating the insulation layer 150 is to be cut during the singulation process. Accordingly, after the singulation process, a cut portion(s) of the additional wiring may remain at the sides of the insulation layer 150 of the singulated wiring substrate (final product) 100A.

The cut portion of the additional wiring may lead to, for example, short-circuiting and rusting when the wiring substrate 100A is used.

However, with the wiring substrate 100A of the first embodiment, the cause of short-circuiting and rusting can be eliminated because no additional wiring penetrating the insulation layer 150 is used. Thereby, a highly reliable wiring substrate 100A can be provided.

In the above-described wiring substrate 100, 100A of the first embodiment, the shapes of the wirings 130A-130E and the shapes of the plating layers 160A1-160E3 are not limited to those described above.

The shapes of the wirings 130A-130E and the shapes of the plating layers 160A1-160E3 may be modified according to, for example, the arrangement of the electronic components mounted on the wiring substrate 100, 100A or the usage of the wiring 130.

In the above-described embodiment of the present invention, the wiring 130 and the bus line 131 are formed on the substrate 110 interposed by the adhesive layer 120.

Alternatively, the wiring 130 and the bus line 131 may be formed as follows. First, a metal layer is directly formed on the front surface of the substrate 110 made of an insulation resin film (e.g., polyimide). The metal layer may be formed by, for example, an electroless plating method, a sputtering method, or an electroplating method using copper. Then, through-holes are formed in the substrate (insulation resin film) 110 by, for example, a laser processing method. Then, the thermal conduction part 140 and the via 141 are formed by electroplating where the metal layer is used as a power feeding layer. Then, the wiring 130 and the bus line 131 are formed by etching the metal layer.

Alternatively, the wiring 130 and the bus line 131 may be formed as follows. First, an insulation resin film is formed by applying an insulation resin (e.g., polyimide) to a metal foil (e.g., copper foil). Then, through-holes are formed in the insulation resin film. Then, the heat conduction part 140 and the via 141 are formed by electroplating where the metal foil is used as a power feeding layer. Then, the wiring 130 and the bus line 131 are formed by etching the metal foil.

In the above-described embodiment of the present invention, the LEDs 190 are mounted on the wiring substrate 100A. Alternatively, for example, an LSI (Large Scale Integrated Circuit) of a BGA (Ball Grid Array) Package may be mounted on the wiring substrate 100A.

Figure 13:
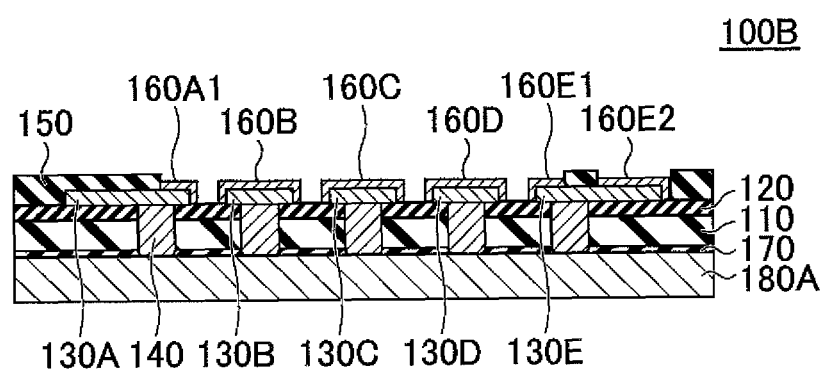
FIG. 13 is a schematic diagram illustrating a cross-sectional view of a wiring substrate according to a modified example of the first embodiment of the present invention.

FIG. 13 is a schematic diagram illustrating a cross-sectional view of a wiring substrate 100B according to a modified example of the first embodiment.

The wiring substrate 100B of the modified example is different from the wiring substrate 100A of the first embodiment (see, for example, FIG. 2B) in that a heat radiation plate 180A of the wiring substrate 100B is formed of an insulation material, and an end part of the thermal conduction part 140 is directly connected to the heat radiation plate 180A without the adhesive layer 170 interposed therebetween.

For example, the heat radiation plate 180A may be formed of ceramic (e.g., alumina, aluminum nitride) or silicon. In a case where the heat radiation plate 180A is formed of silicon, an insulation film such as an oxide film is formed on a front surface of the heat radiation plate 180A. In a case where the heat radiation plate 180A is formed of an insulation material such as ceramic, the potential of the wirings 130A-130E is not affected by directly connecting the heat radiation plate 180A to wirings 130A-130E by way of the thermal conduction part 140.

Therefore, in a case where an insulation material is used for the heat radiation plate 180A, the thermal conduction part 140 can be directly connected to the heat radiation plate 180A without the adhesive layer 170 interposed therebetween. That is, the end (bottom end in FIG. 13) of the thermal conduction part 140 directly contacts the surface of the heat radiation plate 180A by being pressed against the heat radiation plate 180A.

In the case of directly connecting the heat conducting part 140 to the heat radiation plate 180A, the adhesive layer 170 may be patterned to avoid the thermal conduction part 140.

<Comparative Example>

In the following comparative example, the wiring 130 and the bus line 131 are connected on the front surface of the substrate 110. In the comparative example, like components are denoted with like reference numerals as the reference numerals of the wiring substrate 100, 100A of the first embodiment and are not further explained.

Figure 14:
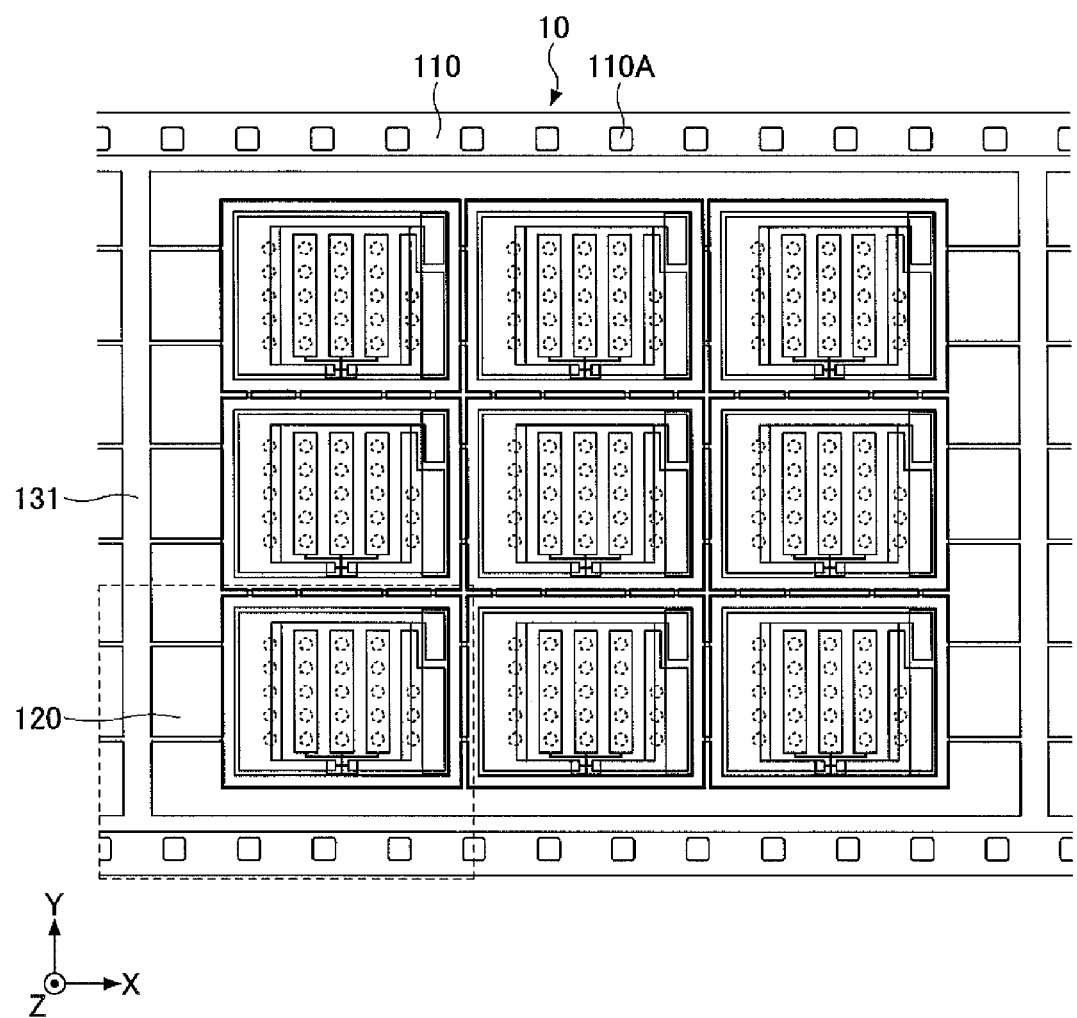
FIG. 14 is a plan view illustrating a wiring substrate according to a comparative example.
Figure 15A:
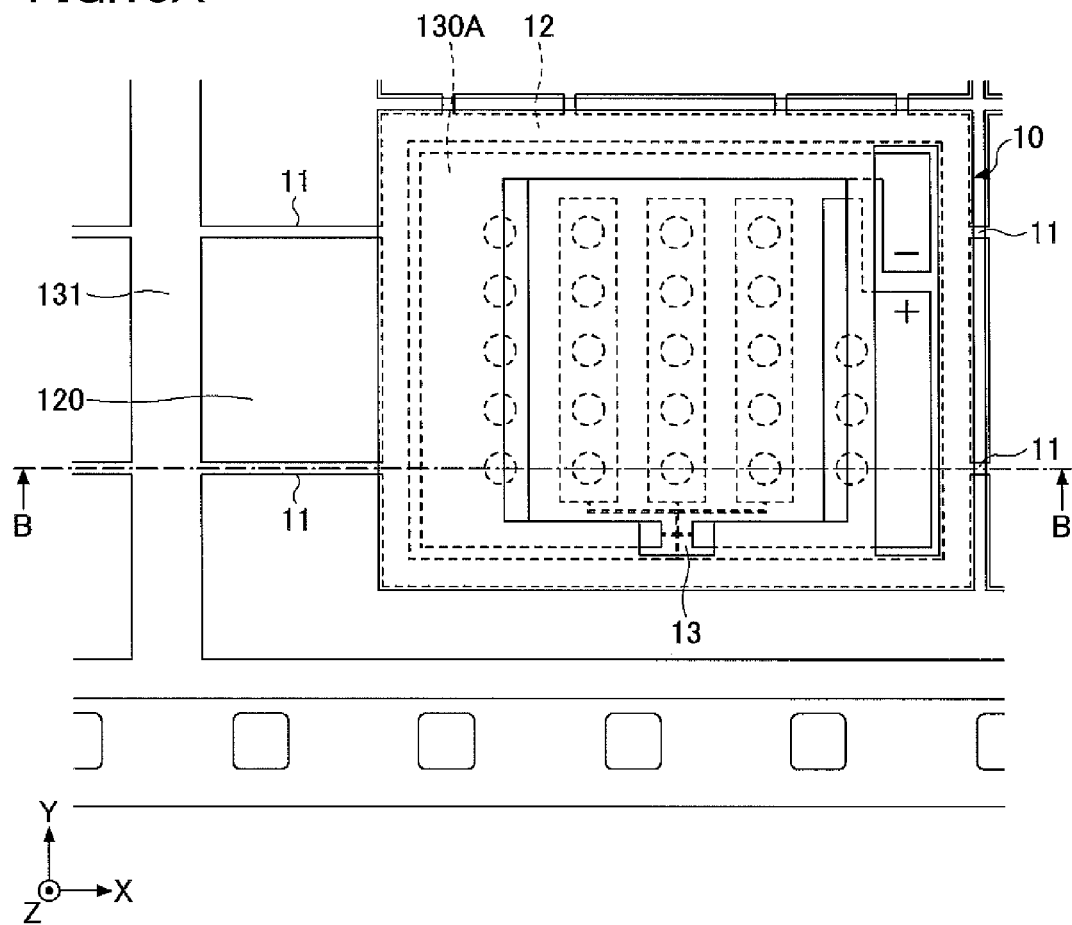
FIGS. 15A and 15B are enlarged views of an area illustrated with broken lines in FIG. 14.
Figure 15B:
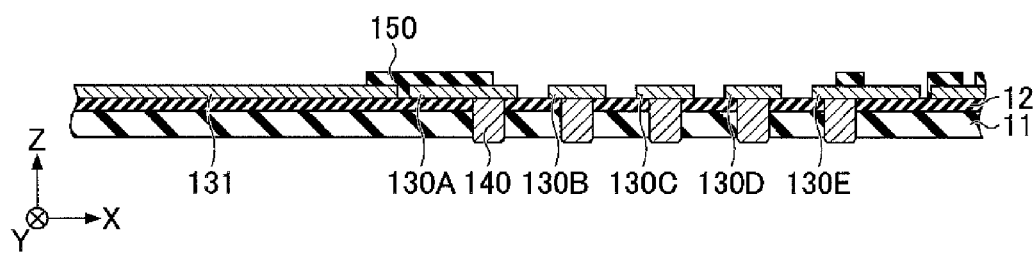

FIG. 14 is a plan view illustrating a wiring substrate 10 according to the comparative example. FIGS. 15A and 15B are enlarged views of an area illustrated with broken lines in FIG. 14, in which FIG. 15A is a plan view of said area, and FIG. 15B is a cross-sectional view taken along line B-B of FIG. 15A. FIGS. 14, 15A, and 15B basically correspond to FIGS. 1, 2A, and 2B of the first embodiment. However, FIGS. 14, 15A, and 15B illustrate a state before the plating layer 160 is formed.

The wiring substrate 10 of the comparative example includes the wirings 130 and the bus line 131 connected by wirings 11, 12, and 13.

More specifically, the wiring 11 is a part that connects the bus line 131 and the wiring 12. The wiring 12, which has a rectangular ring shape, is formed in a periphery of the wirings 130A and 130E. The wiring 12 is covered by the insulation layer 150. The wiring 13 is a part that connects the wiring 12 and the wirings 130A-130E.

In the wiring substrate 10 of the comparative example, the electroplating process for forming the plating layer 160 (see, for example, FIGS. 2A and 22) is performed in a state where power is fed from the bus line 131 to the wirings 130A-1302 by way of the wirings 11, 12, and 13.

Therefore, when singulation of the wiring substrate 10 (illustrated in FIGS. 14, 15A, 15B) is performed along the broken lines of FIG. 15A after forming the plating layer 160 (see, for example, FIGS. 2A and 2B), the wiring 11 is exposed from the insulation layer 15 of the singulated wiring substrate 10.

Accordingly, the exposed wiring 11 may lead to, for example, short-circuiting and rusting of the wiring substrate 10.

Further, with the wiring substrate 10 of the comparative example illustrated in FIGS. 14, 15A, and 15B, the wiring 13 is required to be etched after the electroplating process. This increases the number of steps for manufacturing the wiring substrate 10 and results in increase of manufacturing cost.

On the other hand, with the wiring substrate 100A of the first embodiment, the cause of short-circuiting and rusting can be eliminated because no wiring penetrating the insulation layer 150 is used. Thereby, a highly reliable wiring substrate 100A can be provided. Further, manufacturing cost can be reduced because there is no need for etching of the wiring 13.

[Second Embodiment]

A wiring substrate 200 according to a second embodiment is different from the wiring substrate 100, 100A of the first embodiment in that the method for forming the plating layer 160 is different from that of the wiring substrate 100, 100A of the first embodiment. Further, due to this difference, the configuration of the wiring substrate 200 of the second embodiment is different from that of the wiring substrate 100, 100A of the first embodiment. It is to be noted that, in the wiring substrate 200 of the second embodiment, like components are denoted with like reference numerals as the reference numerals of the wiring substrate 100, 100A of the first embodiment and are not further explained.

Figure 16:
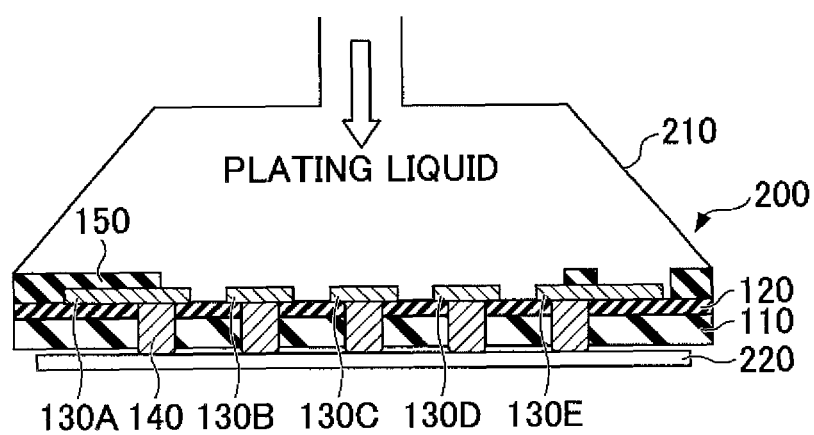
FIG. 16 is a schematic diagram illustrating a state where a wiring substrate is placed in a sparger for performing a plating process according to a second embodiment of the present invention.

FIG. 16 is a schematic diagram illustrating a state where the wiring substrate 200 is placed in a sparger 210 for performing a plating process.

The wiring substrate 200 of the second embodiment is in a state before being singulated and has no bus line 131 (see, for example, FIGS. 1, 2A, and 2B).

Similar to the wiring substrate 100A of the first embodiment illustrated in FIG. 3, FIG. 16 illustrates the wiring substrate 200 in a state after singulation. However, FIG. 16 illustrates the wiring substrate 200 in a state before the plating layer 160 is formed.

As illustrated in FIG. 16, the wiring substrate 200 is placed in the sparger 210, and the bottom end of the thermal conduction part 140 is pressed to a power feeding plate 220.

In the state illustrated in FIG. 16, an electroplating process is performed by feeding power from the power feeding plate 200 to the wirings (wiring layers) 130 (130A-1302) by way of the thermal conduction part 140 and supplying a plating liquid on an upper surface of the wiring substrate 200 placed in the sparger 210. Thereby, the plating layer 160 (see, for example, FIG. 3) can be formed on the wiring 130 (130A-130E).

Although the example illustrated in FIG. 16 performs the electroplating process by placing the singulated wiring substrate 200 in the sparger 210 and pressing the power feeding plate 220 from a bottom side of the wiring substrate 200 to the thermal conduction part 140, an electroplating process can be performed on a tape-like wiring substrate (i.e., the wiring substrate 200 before being singulated) 200 by the below-described method.

Figure 17:
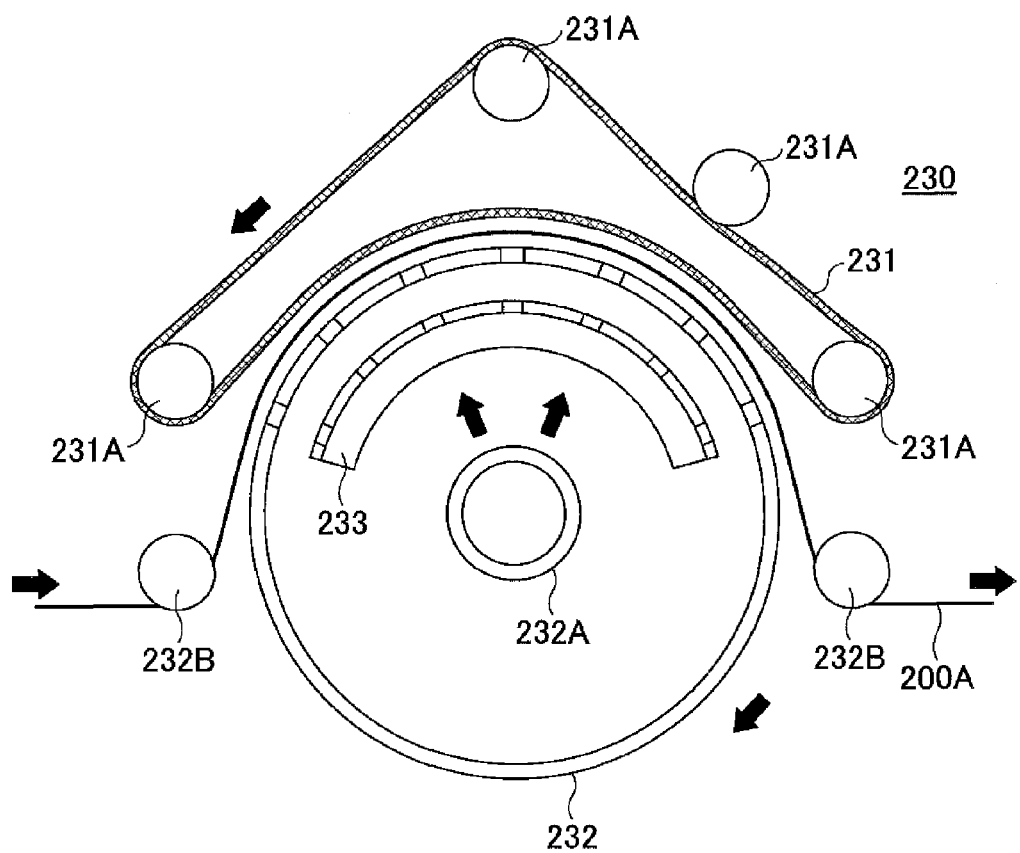
FIG. 17 is a schematic diagram illustrating a plating apparatus used for manufacturing a wiring substrate according to the second embodiment of the present invention.

FIG. 17 is a schematic diagram illustrating a plating apparatus 230 used for manufacturing the wiring substrate 200 according to the second embodiment of the present invention.

The plating apparatus 230 includes a loop-like power-feeding belt 231, a sparger drum 232, and an anode 233.

The power-feeding belt 231 is span around four guide rollers 231A and the sparger drum 232.

The sparger drum 232 is driven to rotate in a clockwise direction by a drive shaft 232A. The sparger drum 232 includes an outer peripheral surface having holes formed therein. The plating liquid emitted from the anode 233 is ejected onto the outer peripheral surface of the sparger drum 232.

Further, two guide rollers 2322 are arranged at the sides of the sparger drum 232. The guide roller 232B on the left side of the sparger drum 232 guides the tape-like wiring substrate 200A at an entrance side of the sparger drum 232 whereas the guide roller 2325 on the right side of the sparger drum 232 guides the tape-like wiring substrate 200A at an exit side of the sparger drum 232.

The anode 233, which is provided on an upper side of the drive shaft 232A of the sparger drum 232, ejects the plating liquid upward to the sparger drum 232.

The tape-like wiring substrate 200A is a tape-like substrate that is in a state before being singulated as the wiring substrate 200 illustrated in FIG. 16. The wiring substrate 200A illustrated in FIG. 17 is positioned upside down compared to the wiring substrate 200 illustrated in FIG. 16. In other words, the wirings 130 (130A-130E) (see, for example, FIG. 16) are positioned on a lower side of the wiring substrate 200A in FIG. 17. In this state, the wiring substrate 200A is guided in a clockwise direction by the sparger drum 232 in a state where the wiring substrate 200A is span around the sparger drum 232 and pressed downward by the power-feeding belt 231 positioned above the sparger drum 232.

When the wiring substrate 200A is being guided by the sparger drum 232, an end part (an end part opposite to an end part connected to the wirings 130A-130E) of the thermal conduction part 140 (see, for example, FIG. 16) of the wiring substrate 200A is in contact with the power-feeding belt 231 and is fed with power from the power-feeding belt by way of the thermal conduction part 140.

Further, when the wiring substrate 200A is being guided by the sparger drum 232, the wirings 130A-130E are in contact with the sparger drum 232 and are supplied with plating liquid from the anode 233 of the sparger drum 232.

Accordingly, during a period where the wiring substrate 200A is guided between the power-feeding belt 231 and the sparger drum 232, the wirings 130 (130A-130E) are fed with power from the power-feeding belt 231 by way of the thermal conduction part 140, and a front surface of the wirings 130 (130A-130E) is fed with plating liquid from the anode 233 by way of the sparger drum 232.

Therefore, during the period where the wiring substrate 200A is guided between the power-feeding belt 231 and the sparger drum 232, the plating layer 160 (see, for example, FIG. 3) is formed on the front surface of the wirings 130 (130A-130E).

Accordingly, with the above-described method, the electroplating method can be performed on the tape-like wiring substrate 200A. Thus, productivity can be improved.

Hence, with the method for manufacturing the wiring substrate according to the second embodiment of the present invention, the plating layer 160 can be formed on the wirings 130 by using the thermal conduction part 140 to feed power from a rear surface of the wiring substrate 200, 200A to the wiring 130.

With the wiring substrate 200, 200A manufactured by the method of the second embodiment, the cause of short-circuiting and rusting can be eliminated because no wiring penetrating the insulation layer 150 is used. Thereby, a highly reliable wiring substrate 200, 200A can be provided.

In addition, similar to the wiring substrate 100A of the first embodiment, by attaching the heat radiation plate 180 with the adhesive layer 170, there can be provided a wiring substrate 200A that can efficiently transfer heat generated by an electronic component connected to one surface of the substrate 110 to the heat radiation plate 180 provided on the other surface of the substrate 110 opposite to the one surface of the substrate 110, and significantly improve heat releasing property.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
   an insulation substrate including
      a first surface,
      a second surface on an opposite side of the first surface, and
      first and second through-holes penetrating the insulation substrate from the first surface to the second surface;
   a wiring layer formed on the first surface of the insulation substrate;
   a first via formed in the first through-hole and having one end connected to the wiring layer and another end projecting from the second surface of the insulation substrate;
   a bus line separated from the wiring layer and the first via, and formed on the first surface of the insulation substrate; and
   a second via formed in the second through-hole and connected to the bus line.

2. The wiring substrate as claimed in claim 1, further comprising:
   a plating layer formed on a front surface of the wiring layer;
   wherein the plating layer is formed by feeding power to the bus line in a state where the first and the second vias are electrically connected on a side toward the second surface of the insulation substrate.

3. The wiring substrate as claimed in claim 1, wherein the bus line encompasses an area in which the wiring layer and the first via are formed.

4. The wiring substrate as claimed in claim 1, wherein the first via is configured to conduct heat between the first surface of the insulation substrate and the second surface of the insulation substrate.

5. A method for manufacturing a wiring substrate, the method comprising:
   forming a wiring layer on a first surface of an insulation substrate;
   forming a first through-hole penetrating the insulation substrate from the first surface to a second surface on an opposite side of the insulation substrate;
   forming a first via in the first through-hole, the first via having one end connected to the wiring layer and another end projecting from the second surface of the insulation substrate;
   forming a metal sheet contacting the first via; and
   forming a plating layer on a front surface of the wiring layer by electroplating in a state where power is fed to the first via and the wiring layer by way of the metal sheet.

6. The method as claimed in claim 5, further comprising:
   forming a second through-hole penetrating the insulation substrate from the first surface to the second surface of the insulation substrate;
   forming a bus line in a position separated from the wiring layer and the first via, on the first surface of the insulation substrate; and
   forming a second via in the second through-hole in connection with the bus line;
   wherein the forming of the metal sheet includes forming the metal sheet to contact the second via,
   wherein the plating layer is formed while feeding power to the metal sheet by way of the second via by feeding power to the bus line.

7. The method as claimed in claim 6,
   wherein the bus line and the second via are separated from the wiring layer and the first via,
   wherein the bus line and the second via are electrically insulated from the wiring layer and the first via.

8. The method as claimed in claim 5, wherein the forming of the plating layer includes forming the plating layer by using a sparger while feeding power to the metal sheet.

9. The method as claimed in claim 5, further comprising:
   forming an insulation layer that exposes a part of the wiring layer as a terminal, on the wiring layer.

10. The method as claimed in claim 5, wherein the first via is configured to conduct heat between the first surface of the insulation substrate and the second surface of the insulation substrate.

11. A wiring substrate comprising:
    an insulation substrate including
       a first surface,
       a second surface on an opposite side of the first surface, and
       first and second through-holes penetrating the insulation substrate from the first surface to the second surface;
    a wiring layer formed on the first surface of the insulation substrate;
    a first via formed in the first through-hole and connected to the wiring layer;
    a bus line separated from the wiring layer and the first via, and formed on the first surface of the insulation substrate; and
    a second via formed in the second through-hole and connected to the bus line;
    wherein the bus line and the second via are separated from the wiring layer and the first via, and wherein the bus line and the second via are electrically insulated from the wiring layer and the first via.

12. The wiring substrate as claimed in claim 11, further comprising:
a plating layer formed on a front surface of the wiring layer;
wherein the plating layer is formed by feeding power to the bus line in a state where the first and the second vias are electrically connected on a side toward the second surface of the insulation substrate.

13. The wiring substrate as claimed in claim 11, wherein the bus line encompasses an area in which the wiring layer and the first via are formed.

14. The wiring substrate as claimed in claim 11, wherein the first via is configured to conduct heat between the first surface of the insulation substrate and the second surface of the insulation substrate.

15. The wiring substrate as claimed in claim 11,
wherein the first via has one end connected to the wiring layer and another end projecting from the second surface of the insulation substrate,
wherein the second via has one end connected to the bus line and another end projecting from the second surface of the insulation substrate.

* * * * *